US010120574B2

(12) United States Patent
Baptist et al.

(10) Patent No.: US 10,120,574 B2
(45) Date of Patent: Nov. 6, 2018

(54) REVERSIBLE DATA MODIFICATIONS WITHIN DS UNITS

(71) Applicant: International Business Machines Corporation, Armonk, NY (US)

(72) Inventors: Andrew D. Baptist, Mt. Pleasant, WI (US); Asimuddin Kazi, Naperville, IL (US); Wesley B. Leggette, Chicago, IL (US); Niall J. McShane, Arlington Heights, IL (US); Manish Motwani, Chicago, IL (US); Jason K. Resch, Chicago, IL (US); Ilya Volvovski, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 15/357,622

(22) Filed: Nov. 21, 2016

(65) Prior Publication Data
US 2017/0075585 A1 Mar. 16, 2017

Related U.S. Application Data

(63) Continuation-in-part of application No. 15/012,555, filed on Feb. 1, 2016, now Pat. No. 9,547,548, which
(Continued)

(51) Int. Cl.
*G06F 11/08* (2006.01)
*G06F 3/06* (2006.01)
(Continued)

(52) U.S. Cl.
CPC ............ *G06F 3/0605* (2013.01); *G06F 3/064* (2013.01); *G06F 3/067* (2013.01); *G06F 3/0619* (2013.01);
(Continued)

(58) Field of Classification Search
CPC ............ G06F 11/0727; G06F 11/1092; G06F 2211/1028
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Chae M Ko
(74) *Attorney, Agent, or Firm* — Garlick & Markison; Timothy W. Markison; Patricia A. Markison

(57) ABSTRACT

A method includes sending a set of destructive modification requests to a set of storage units regarding a set of encoded data slices. The method further includes determining, by each storage unit of a decode threshold number of storage units of the set of storage units, whether to preserve a respective corresponding one of the decode threshold number of encoded data slices prior to executing a corresponding one of the set of destructive modification requests. When determined to preserve the respective corresponding one of the decode threshold number of encoded data slices, determining, by a first storage unit of the decode threshold number of storage units, to flag a first encoded data slice of the decode threshold number of encoded data slices or temporarily store a copy of the first encoded data slice. When determined to flag the first encoded data slice, flagging the first encoded data slice as preserved.

18 Claims, 6 Drawing Sheets

Related U.S. Application Data is a continuation of application No. 13/890,438, filed on May 9, 2013, now Pat. No. 9,292,212.

(60) Provisional application No. 61/663,796, filed on Jun. 25, 2012.

(51) Int. Cl.
  *G06F 11/10* (2006.01)
  *H03M 13/37* (2006.01)
  *H03M 13/15* (2006.01)
  *G06F 11/00* (2006.01)

(52) U.S. Cl.
  CPC ............ *G06F 3/0659* (2013.01); *G06F 11/10* (2013.01); *G06F 11/1076* (2013.01); *G06F 11/1092* (2013.01); *H03M 13/3761* (2013.01); *G06F 11/008* (2013.01); *G06F 2201/81* (2013.01); *G06F 2211/109* (2013.01); *H03M 13/1515* (2013.01)

(58) Field of Classification Search
  USPC ........................................................ 714/6.22
  See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1* | 7/2002 | Peters ................ | G06F 11/1076 348/E5.008 |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0120763 A1* | 8/2002 | Miloushev ......... | G06F 11/1076 709/230 |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0133606 A1* | 7/2004 | Miloushev ........ | G06F 17/30091 |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0223269 A1* | 10/2005 | Stolowitz .............. | G06F 3/0617 714/6.12 |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0034377 A1* | 2/2009 | English ................ | G06F 3/0613 369/47.13 |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0029809 A1* | 2/2011 | Dhuse ................. | G06F 11/1076 714/6.1 |
| 2014/0181033 A1* | 6/2014 | Pawar ................. | G06F 11/1474 707/644 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

(56) References Cited

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 1511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

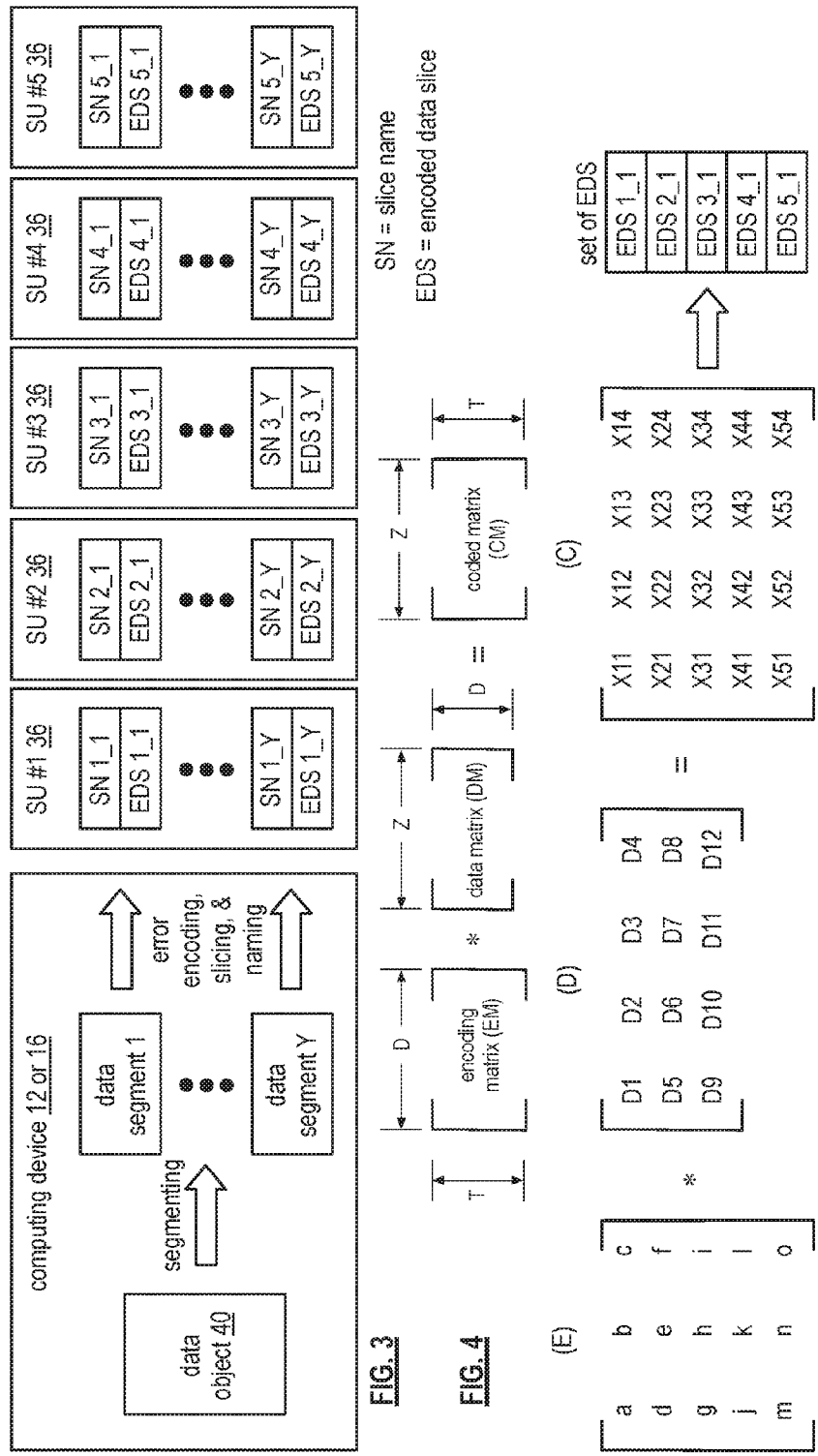

REVERSIBLE DATA MODIFICATIONS WITHIN DS UNITS

CROSS-REFERENCE TO RELATED APPLICATIONS

This application claims priority pursuant to 35 U.S.C. § 120 as a continuation-in-part of U.S. Utility application Ser. No. 15/012,555, entitled "DETECTING STORAGE ERRORS IN A DISPERSED STORAGE NETWORK," filed Feb. 1, 2016, which claims priority pursuant to 35 U.S.C. § 120 as a continuation of U.S. Utility application Ser. No. 13/890,438, entitled "DETECTING STORAGE ERRORS IN A DISPERSED STORAGE NETWORK," filed May 9, 2013, issued on Mar. 22, 2016 as U.S. Pat. No. 9,292,212, which claims priority pursuant to 35 U.S.C. § 119(e) to U.S. Provisional Application No. 61/663,796, entitled "ACCESSING A DISTRIBUTED STORAGE AND TASK NETWORK," filed Jun. 25, 2012, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
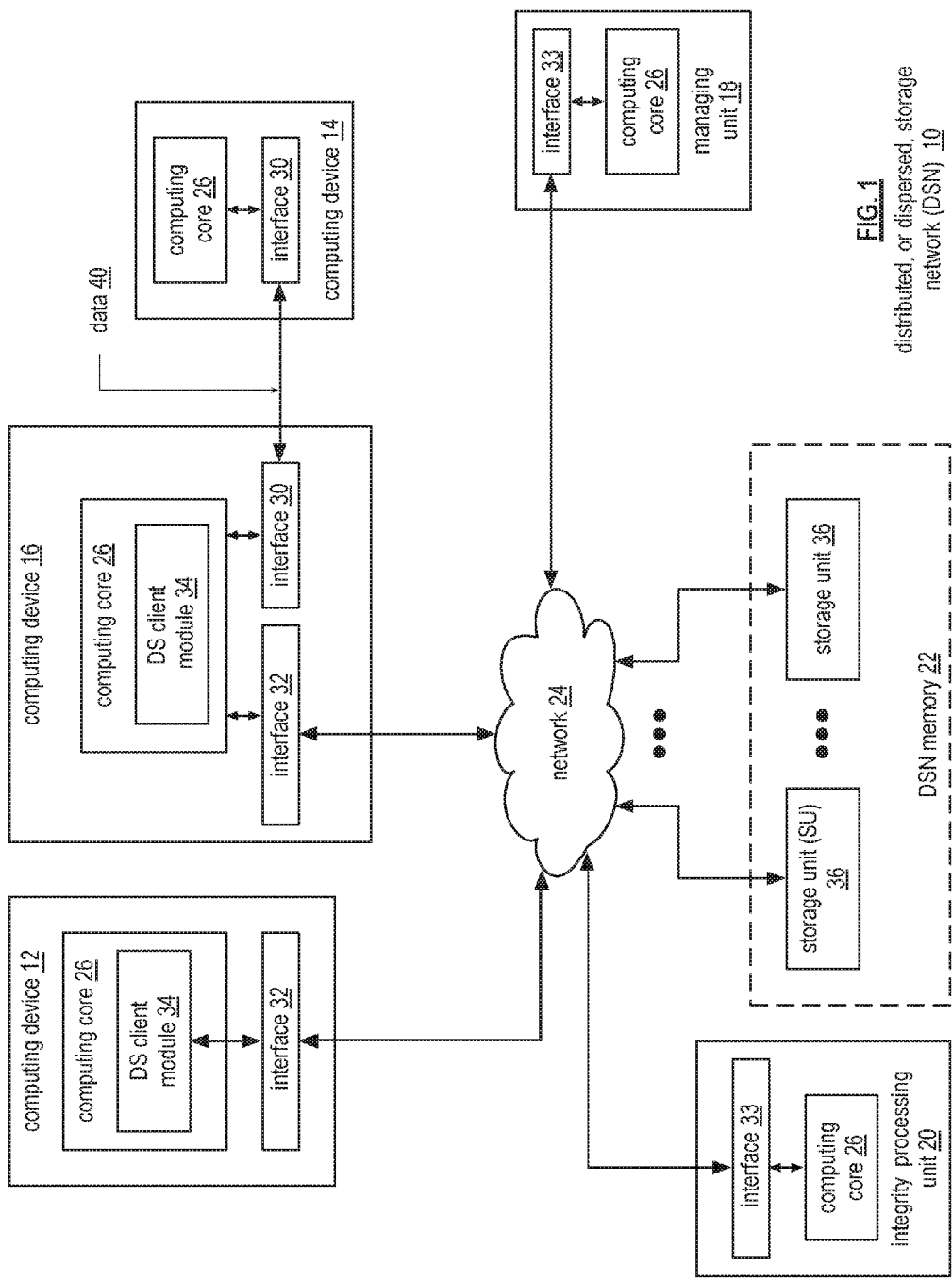
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
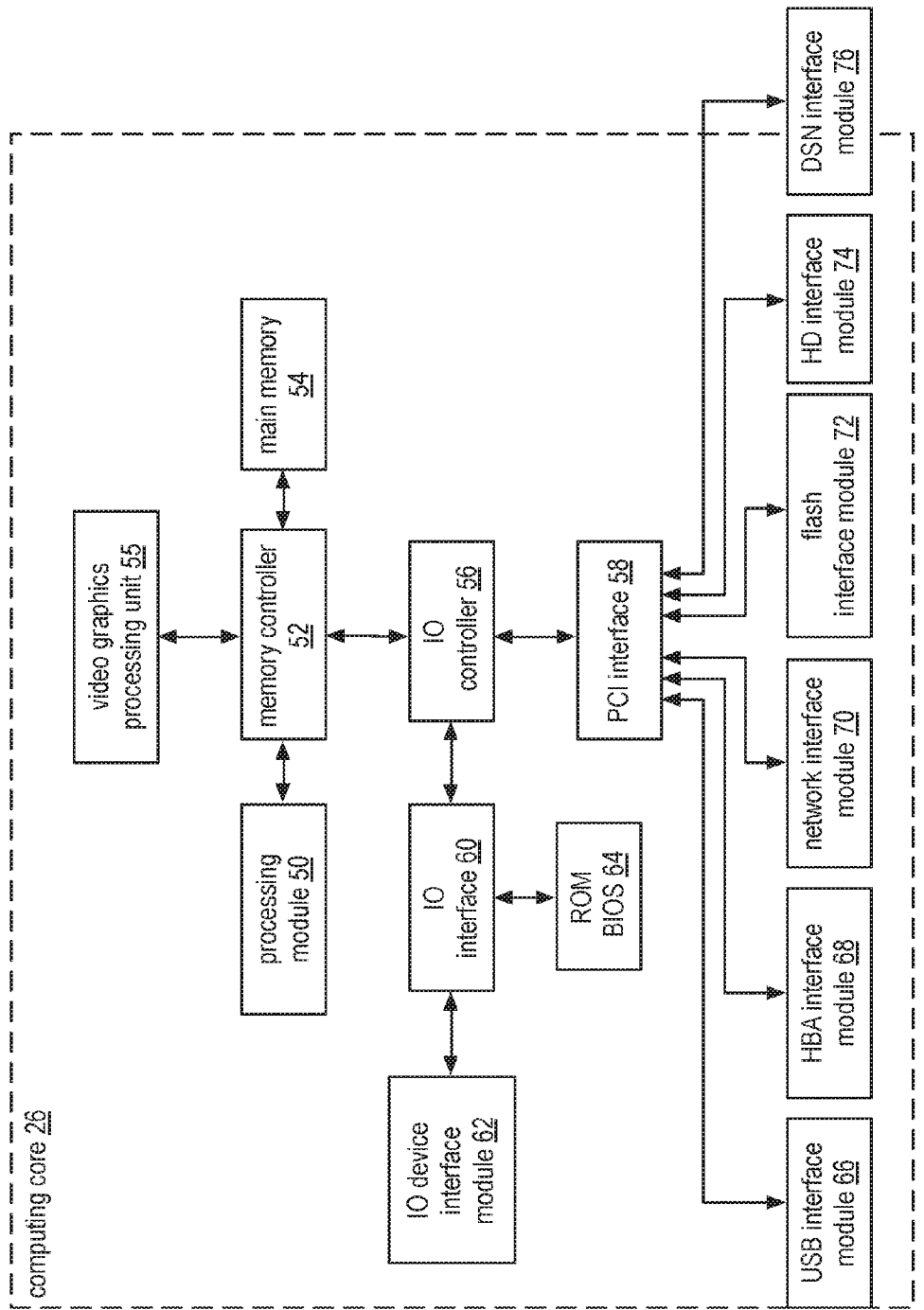
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
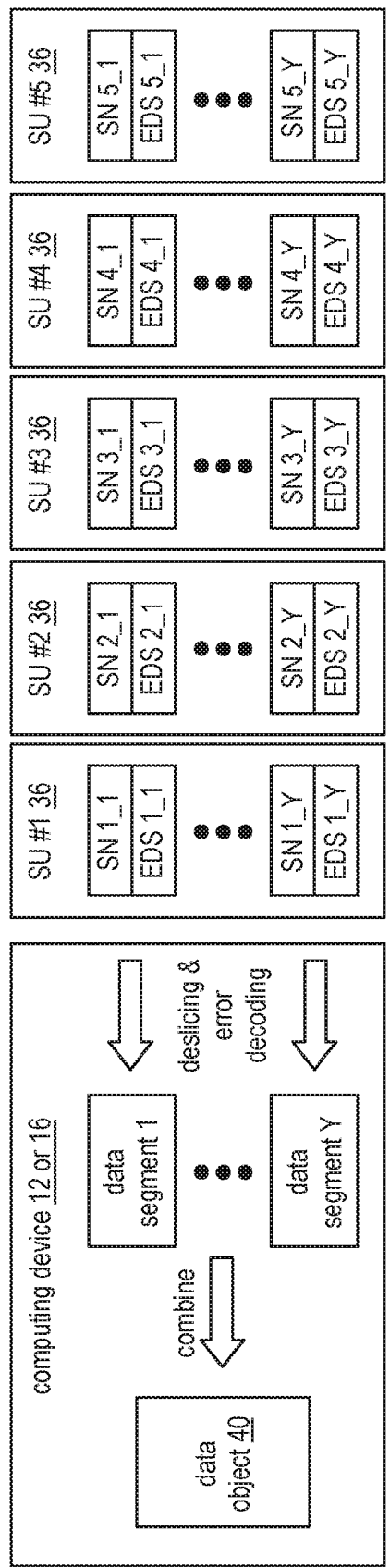
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
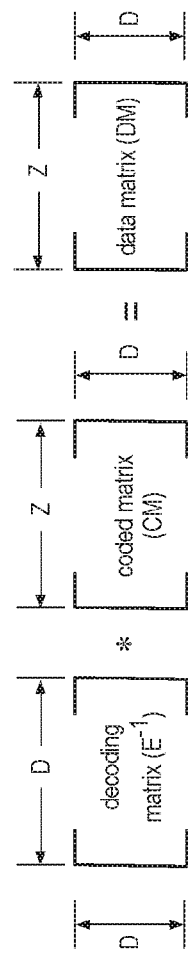
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
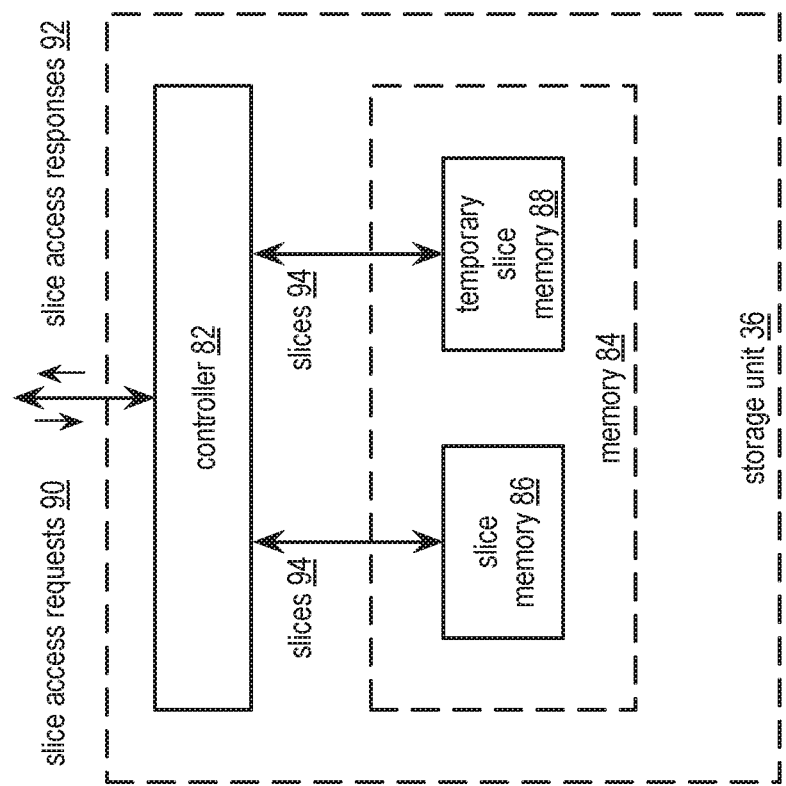
FIG. 9 is a schematic block diagram illustrating an embodiment of storage unit of a set of storage units of a dispersed storage network (DSN) in accordance with the present invention.

FIG. 9 is a schematic block diagram illustrating an embodiment of a storage unit of a set of storage units of a dispersed storage network (DSN)) that includes a controller 82 and a memory 84. The memory 84 includes slice memory 86 and temporary slice memory 88. The controller 82 functions to receive slice access requests 90 from a computing device of the DSN regarding encoded data slices 94 stored in the memory 84. Slice access requests may result in the destructive modification of slices (e.g., the request may be to delete, overwrite, modify, or revise the slice). The controller 82 further functions to generate slice access responses 92 with regards to the slice access requests 90.

The slice access request 90 may include one or more of a slice name, a request type, and a slice. The slice access response 92 may include one or more of a slice name, a response type, and a slice.

A data segment of a data object is dispersed storage error encoded to produce a set of encoded data slices where a decode threshold number of encoded data slices of the set of encoded data slices is needed to recover the data segment. The set of encoded data slices are stored in a set of storage units such that a decode threshold number of storage units of the set of storage units must be accessed to retrieve the decode threshold number of encoded data slice. The set of encoded data slices are initially stored in the slice memory 86 of the memory 84. An encoded data slice storage lifecycle for a storage unit of the set of storage units includes storing a slice, reading the slice, performing slice access requests, and deleting the slice when it is believed the slice is no longer required. From time to time it may be desired to read a slice subsequent to destructive modification (e.g., deletion) of the slice. For example, a user computing device may request destructive modification of shared data stored as a set of encoded data slices in a set of storage units. Because the data is of a shared nature, each storage unit of a decode threshold number of the set of storage units may determine to preserve or temporarily store a respective corresponding one of the decode threshold number of encoded data slices prior to destructively modifying the shared data. In response to a destructive modification request, each storage unit 36 supports a reversibility approach to support a determined level of slice availability.

The reversibility approach may be accomplished in a variety of ways. In a first way, after receiving a destructive modification request of a set of destructive modification requests, each storage unit of a decode threshold number of storage units of the set of storage units may determine to preserve a respective corresponding one of the decode threshold number of encoded data slices by flagging the respective corresponding encoded data slice stored in slice memory 86 as preserved. A flag is set to indicate that the destructive modification request slice request was received but the slice is not physically deleted from the slice memory 86 or destructively modified in any way. The slice is retrieved from the slice memory 86 and utilized to form a slice access response 92 when a slice read request is received subsequent to the destructive modification request. The flagged slice may be deleted or modified according to the destructive modification request upon an expiration time period after receiving the destructive modification request.

In a second way, after receiving a destructive modification request of a set of destructive modification requests, each storage unit of the decode threshold number of storage units may determine to store a corresponding encoded data slice of the decode threshold number of encoded data slices stored in temporary slice memory 88. The slice may be moved from the slice memory 86 to the temporary slice memory 88 when the destructive modification request is received. The slice is retrieved from the temporary slice memory 88 and utilized to form the slice access response 92 when the slice read request is received subsequent to the destructive modification request. The slice may be deleted or modified according to the destructive modification request upon the expiration of the time period after receiving the destructive modification request.

Alternatively, when each storage unit of the decode threshold number of storage units determines to store a corresponding encoded data slice of the decode threshold number of encoded data slices in temporary slice memory 88, the storage units may store a copy of the corresponding encoded data slice of the decode threshold number of encoded data slices stored in temporary slice memory 88 and execute the corresponding one of the set of destructive modification requests on the original corresponding encoded data slice. The copy of the corresponding encoded data slice of the decode threshold number of encoded data slices may be deleted upon the expiration of the time period after receiving the destructive modification request. A method of operation of the storage unit is discussed in greater detail with reference to FIG. 10.

Figure 10:
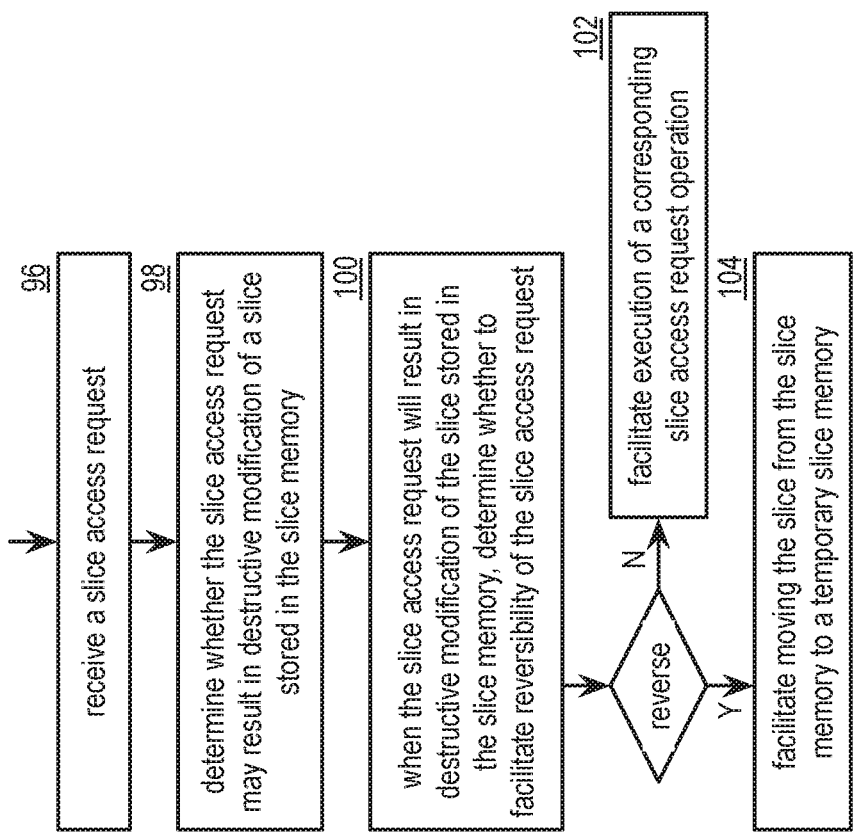
FIG. 10 is a flowchart illustrating an example of processing a slice access request in accordance with the present invention.

FIG. 10 is a flowchart illustrating an example of processing a slice access request. The method begins at step 96 where a set of storage units of the DSN receives a set of slice access requests from a computing device. A data segment of a data object is dispersed storage error encoded to produce the set of encoded data slices, and a decode threshold number of encoded data slices of the set of encoded data slices is needed to recover the data segment. The slice access requests include one or more of a requesting entity identifier (ID), a request type, a slice, a revision number, a priority indicator, and a certainty level indicator. The method continues at step 98 where each storage unit of a decode threshold number of storage units of the set of storage units determines whether the slice access request may result in destructive modification of a slice stored in the slice memory (e.g., whether the set of slice access requests are a set of destructive modification requests). The determining includes comparing the request type to a list of request types associated with the destructive modification of the slice. The list of request types includes one or more of a delete type, an overwrite type, a modification type, and a new revision type.

When the slice access request will result in destructive modification of the slice stored in the slice memory (e.g., the set of slice access requests are a set of destructive modification requests), the method continues at step 100 where the processing module determines whether to facilitate reversibility of the slice access request. At this step, each storage unit of a decode threshold number of storage units of the set of storage units determines whether to preserve a respective corresponding one of the decode threshold number of encoded data slices prior to executing a corresponding one of the set of destructive modification requests. The determining may be based on one or more of the request type, the requesting entity ID, the priority indicator, the certainty level indicator, and a memory availability level indicator. For example, the processing module determines to facilitate reversibility of the slice access request when the certainty indicator indicates a low level of certainty that subsequent brief read slice requests will be issued to the storage unit with regards to the slice. As another example, the processing module determines not to facilitate reversibility of the slice access request when the memory availability level indicator indicates that less than a memory level threshold amount of available memory is available.

When the storage units determine to facilitate reversibility, the method continues to step 104 where each of the decode threshold number of storage units determines to either flag a respective corresponding encoded data slice of the decode threshold number of encoded data slices as preserved or temporarily store the respective corresponding encoded data slice of the decode threshold number of encoded data slices. When determined to temporarily store the respective corresponding encoded data slice of the decode threshold number of encoded data slices, each storage unit may move the corresponding slice from the slice memory to a temporary slice memory. Facilitating moving the slice to temporary memory includes one or more of retrieving the slice from the slice memory, storing the slice in the temporary slice memory, obtaining metadata associated with the slice (e.g., slicing, revision number, timestamp, etc.), and storing the metadata in the temporary slice memory. The respective corresponding encoded data slice may be deleted from temporary memory or modified according to the destructive modification request upon the expiration of the time period after receiving the destructive modification request.

Alternatively, when each storage unit of the decode threshold number of storage units determines to store a corresponding encoded data slice of the decode threshold number of encoded data slices stored in temporary slice memory, each storage unit may store a copy of the corresponding encoded data slice of the decode threshold number of encoded data slices in temporary slice memory and execute the corresponding one of the set of destructive modification requests on the original corresponding encoded data slice. The copy of the corresponding encoded data slice of the decode threshold number of encoded data slices may be deleted upon the expiration of the time period after receiving the destructive modification request.

When each storage unit of the decode threshold number of storage units determines determined to flag a corresponding encoded data slice as preserved, a flag is set to indicate that the destructive modification request was received but the slice is not physically deleted from the slice memory or destructively modified in any way. The storage units may execute the corresponding one of the set of destructive modification requests on the corresponding encoded data slices flagged as preserved after expiration of a time period.

When the processing module determines not to facilitate reversibility, the method continues to step 102 where the storage units facilitate execution of a corresponding slice access request operation. Therefore, when the storage units determine not to preserve the respective corresponding one of the decode threshold number of encoded data slices, each storage unit of a decode threshold number of storage units of the set of storage units, executes the corresponding one of the set of destructive modification requests.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
    sending, by a computing device of a dispersed storage network (DSN), a set of destructive modification requests to a set of storage units of the DSN regarding a set of encoded data slices, wherein a data segment of a data object is dispersed storage error encoded to produce the set of encoded data slices, wherein a decode threshold number of encoded data slices of the set of encoded data slices is needed to recover the data segment;
    determining, by each storage unit of a decode threshold number of storage units of the set of storage units, whether to preserve a respective corresponding one of the decode threshold number of encoded data slices prior to executing a corresponding one of the set of destructive modification requests;
    when determined to preserve the respective corresponding one of the decode threshold number of encoded data slices prior to executing the corresponding one of the set of destructive modification requests, determining, by a first storage unit of the decode threshold number of storage units, to flag a first encoded data slice of the decode threshold number of encoded data slices or temporarily store the first encoded data slice, wherein the first encoded data slice is the respective corresponding one of the decode threshold number of encoded data slices of the first storage unit; and
    when determined to flag the first encoded data slice, flagging, by the first storage unit, the first encoded data slice as preserved.

2. The method of claim 1, wherein a destructive modification request of the set of destructive modification requests comprises one of:
    a delete type;
    an overwrite type;
    a modification type; and
    a new revision type.

3. The method of claim 1, wherein the determining to preserve the corresponding one of the decode threshold number of encoded data slices is based on one or more of:
    a request type;
    a requesting entity ID;
    a priority indicator;
    a certainty level indicator; and
    a memory availability level indicator.

4. The method of claim 1 further comprises:
when determined not to preserve the respective corresponding one of the decode threshold number of encoded data slices, executing, by each storage unit of a decode threshold number of storage units of the set of storage units, the corresponding one of the set of destructive modification requests.

5. The method of claim 1 further comprises:
when determined to temporarily store the first encoded data slice, storing a copy of the first encoded data slice in temporary memory and executing the corresponding one of the set of destructive modification requests on the first encoded data slice.

6. The method of claim 5 further comprises:
deleting the copy of the first encoded data slice from the temporary memory after expiration of a time period.

7. The method of claim 1 further comprises:
when determined to temporarily store the first encoded data slice, moving the first encoded data slice to temporary memory.

8. The method of claim 7 further comprises:
executing the corresponding one of the set of destructive modification requests on the first encoded data slice stored in temporary memory after expiration of a time period.

9. The method of claim 1 further comprises:
executing the corresponding one of the set of destructive modification requests on the first encoded data slice flagged as preserved after expiration of a time period.

10. A computer readable memory comprises:
a first memory element that stores operational instructions that, when executed by a computing device of a dispersed storage network (DSN), cause the computing device to:
send a set of destructive modification requests to a set of storage units of the DSN regarding a set of encoded data slices, wherein a data segment of a data object is dispersed storage error encoded to produce the set of encoded data slices, wherein a decode threshold number of encoded data slices of the set of encoded data slices is needed to recover the data segment; and
a second memory element that stores operational instructions that, when executed by the set of storage units, cause the set of storage units to:
determine, by each storage unit of a decode threshold number of storage units of the set of storage units, whether to preserve a respective corresponding one of the decode threshold number of encoded data slices prior to executing a corresponding one of the set of destructive modification requests;
when determined to preserve the respective corresponding one of the decode threshold number of encoded data slices prior to executing the corresponding one of the set of destructive modification requests, determine, by a first storage unit of the decode threshold number of storage units, to flag a first encoded data slice of the decode threshold number of encoded data slices or temporarily store a copy of the first encoded data slice, wherein the first encoded data slice is the respective corresponding one of the decode threshold number of encoded data slices of the first storage unit; and
when determined to flag the first encoded data slice, flag, by the first storage unit, the first encoded data slice as preserved.

11. The computer readable memory of claim 10, wherein a destructive modification request of the set of destructive modification requests comprises one of:
a delete type;
an overwrite type;
a modification type; and
a new revision type.

12. The computer readable memory of claim 10, wherein the second memory element further stores operational instructions that, when executed by set of storage units, cause the set of storage units to determine to preserve the corresponding one of the decode threshold number of encoded data slices based on one or more of:
a request type;
a requesting entity ID;
a priority indicator;
a certainty level indicator; and
a memory availability level indicator.

13. The computer readable memory of claim 10, wherein the second memory element further stores operational instructions that, when executed by set of storage units, cause the set of storage units to:
when determined not to preserve the respective corresponding one of the decode threshold number of encoded data slices, execute, by each storage unit of a decode threshold number of storage units of the set of storage units, the corresponding one of the set of destructive modification requests.

14. The computer readable memory of claim 10, wherein the second memory element further stores operational instructions that, when executed by set of storage units, cause the set of storage units to:
when determined to temporarily store the first encoded data slice, store a copy of the first encoded data slice in temporary memory and execute the corresponding one of the set of destructive modification requests on the first encoded data slice.

15. The computer readable memory of claim 14, wherein the second memory element further stores operational instructions that, when executed by set of storage units, cause the set of storage units to:
delete the copy of the first encoded data slice from the temporary memory after expiration of a time period.

16. The computer readable memory of claim 10, wherein the second memory element further stores operational instructions that, when executed by set of storage units, cause the set of storage units to:
when determined to temporarily store the first encoded data slice, move the first encoded data slice to temporary memory.

17. The computer readable memory of claim 16, wherein the second memory element further stores operational instructions that, when executed by set of storage units, cause the set of storage units to:
executing the corresponding one of the set of destructive modification requests on the first encoded data slice stored in temporary memory after expiration of a time period.

18. The computer readable memory of claim 10 wherein the second memory element further stores operational instructions that, when executed by set of storage units, cause the set of storage units to:
execute the corresponding one of the set of destructive modification requests on the first encoded data slice flagged as preserved after expiration of a time period.

* * * * *